United States Patent
Bishop et al.

(10) Patent No.: US 10,156,739 B2
(45) Date of Patent: Dec. 18, 2018

(54) ULTRAVIOLET-BLOCKING PHOTOVOLTAIC SUNGLASSES

(71) Applicant: International Business Machines Corporation, Armonk, NY (US)

(72) Inventors: Douglas M. Bishop, New York, NY (US); Saurabh Singh, Yonkers, NY (US); Teodor K. Todorov, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 117 days.

(21) Appl. No.: 15/431,867

(22) Filed: Feb. 14, 2017

(65) Prior Publication Data

US 2018/0231804 A1    Aug. 16, 2018

(51) Int. Cl.
| | |
|---|---|
| G02C 11/00 | (2006.01) |
| H01L 31/054 | (2014.01) |
| H01L 31/032 | (2006.01) |
| H01L 31/028 | (2006.01) |
| H01L 31/0312 | (2006.01) |
| H01L 31/0304 | (2006.01) |

(Continued)

(52) U.S. Cl.
CPC ............ *G02C 11/10* (2013.01); *G02C 3/006* (2013.01); *G02C 7/108* (2013.01); *H01L 31/028* (2013.01); *H01L 31/022466* (2013.01); *H01L 31/032* (2013.01); *H01L 31/0304* (2013.01); *H01L 31/0312* (2013.01); *H01L 31/0322* (2013.01); *H01L 31/0324* (2013.01); *H01L 31/0326* (2013.01); *H01L 31/0543* (2014.12); *H01L 31/0549* (2014.12); *H01L 31/18* (2013.01)

(58) Field of Classification Search
CPC ......... G02C 11/10; G02C 7/024; G02C 7/083
USPC ........ 351/159.01, 159.39, 159.49, 159.6, 41; 359/270, 265; 136/244, 256, 252
See application file for complete search history.

(56) References Cited

U.S. PATENT DOCUMENTS

| | | |
|---|---|---|
| 4,902,120 A | 2/1990 | Weyer |
| 5,377,037 A | 12/1994 | Branz et al. |

(Continued)

OTHER PUBLICATIONS

J. Heimbuch, "PV Sunglasses Convert Rays to Energy with Style," Treehugger, Dec. 22, 2008, downloaded from the Internet, Jan. 23, 2017, http://www.treehugger.com/clean-technology/pv-sunglasses-convert-rays-to-energy-with-style.html (3 pages).

(Continued)

*Primary Examiner* — Hung Dang
(74) *Attorney, Agent, or Firm* — Vazken Alexanian; Michael J. Chang, LLC

(57) ABSTRACT

Techniques for integrating photovoltaics into wearables, such as eyewear, are provided. In one aspect, a method of forming a lens for photovoltaic eyewear includes: forming a semitransparent photovoltaic film on at least a portion of a viewable area of the lens, wherein the semitransparent photovoltaic film includes an inorganic absorber material having a band gap of from about 1.4 eV to about 2.2 eV, and ranges therebetween. The semitransparent photovoltaic film can be configured to block greater than about 99.9% UVA, UVB, and UVC light rays, and from about 95% to about 99%, and ranges therebetween, of HEV light rays from passing therethrough. Photovoltaic eyewear formed by the present techniques is also provided.

22 Claims, 12 Drawing Sheets

(51) Int. Cl.
    *H01L 31/0224*     (2006.01)
    *H01L 31/18*     (2006.01)
    *G02C 7/10*     (2006.01)
    *G02C 3/00*     (2006.01)

(56) References Cited

U.S. PATENT DOCUMENTS

| | | | |
|---|---|---|---|
| 6,130,772 | A | 10/2000 | Cava |
| 6,429,318 | B1 | 8/2002 | Mitzi |
| 7,370,963 | B2 * | 5/2008 | Cano ................ B29D 11/00826 351/159.6 |
| 8,124,870 | B2 | 2/2012 | Woods et al. |
| 9,472,709 | B2 | 10/2016 | Mahajan et al. |
| 2005/0122469 | A1 | 6/2005 | Brabec |
| 2014/0198371 | A1 | 7/2014 | Conklin et al. |
| 2015/0255651 | A1 | 9/2015 | Barr et al. |

OTHER PUBLICATIONS

Bharat, "Solar-powered Ray Ban sunglasses that charge your iPhone," Damngeeky, 2013, downloaded from the Internet, Jan. 23, 2017, http://www.damngeeky.com/2013/11/13/15474/solar-powered-ray-ban-sunglasses-charge-iphone.html (11 pages).

Ablayev et al., "Semitransparent solar modules based on amorphous and microcrystalline silicon," Journal of Physics: Conference Series, vol. 572 (Dec. 2014) (6 pages).

Liu et al., "Efficient planar heterojunction perovskite solar cells by vapour deposition," Nature vol. 501, 395-398 (Sep. 2013).

A. Kojima et al., "Organometal Halide Perovskites as Visible-Light Sensitizers for Photovoltaic Cells," Journal of the American Chemical Society, vol. 131, pp. 6050-6051, (Apr. 2009).

Moon et al., "Highly efficient single-junction GaAs thin-film solar cell on flexible substrate," Nature, Scientific Reports 6, Article No. 30107, (Jul. 2016) (6 pages).

\* cited by examiner

Primary direction of light

ULTRAVIOLET-BLOCKING PHOTOVOLTAIC SUNGLASSES

FIELD OF THE INVENTION

The present invention relates to photovoltaic-based devices, and more particularly, to the integration of photovoltaics into wearables, such as eyewear (e.g., sunglasses, goggles, etc.), offering beneficial ultraviolet (UV) light-blocking properties for the wearer.

BACKGROUND OF THE INVENTION

With an increased use of smart devices comes an increased need for available power sources to drive these devices. Having to continually recharge devices at fixed location power sources is inconvenient and cuts down on overall mobility. One approach to extend the operation away from the power grid is by use of intermediate rechargeable power banks that are however cumbersome, expensive and not fully effective as regular recharging is still required.

Photovoltaics employ renewable energy sources to generate power. As long as a light source is available, photovoltaic-based devices have power. Wearables such as glasses are a suitable platform for integrating a range of wearable devices such as video, audio sensors, activity sensors, speakers, displays, global positioning system (GPS), and other environmental sensors. Glasses that integrate such products are increasingly commercially available, however all of these devices require a significant amount of power and have limited battery life.

Thus, it would be desirable to integrate photovoltaic power producing capabilities with smart devices as a mobile, renewable energy source for the devices.

SUMMARY OF THE INVENTION

The present invention provides techniques for integrating photovoltaics into wearables, such as eyewear (e.g., sunglasses, goggles, etc.), having beneficial ultraviolet (UV) light-blocking properties. In one aspect of the invention, a method of forming a lens for photovoltaic eyewear is provided. The method includes the step of: forming a semitransparent photovoltaic film on at least a portion of a viewable area of the lens, wherein the semitransparent photovoltaic film includes an inorganic absorber material having a band gap of from about 1.4 eV to about 2.2 eV, and ranges therebetween. The semitransparent photovoltaic film can be configured to block greater than about 99.9% UVA, UVB, and UVC light rays, and from about 95% to about 99%, and ranges therebetween, of HEV light rays from passing therethrough.

In another aspect of the invention, photovoltaic eyewear is provided. The photovoltaic eyewear includes: at least one lens; and a semitransparent photovoltaic film on at least a portion of a viewable area of the at least one lens, wherein the semitransparent photovoltaic film includes an inorganic absorber material having a band gap of from about 1.4 eV to about 2.2 eV, and ranges therebetween. The semitransparent photovoltaic film can be formed on an inside of the lens (i.e., so as to face a user of the photovoltaic eyewear) or, alternatively, on an outside of the lens (i.e., so as to face away from the user). The photovoltaic eyewear can further include a neck strap, and the semitransparent photovoltaic film can also be affixed to the neck strap.

A more complete understanding of the present invention, as well as further features and advantages of the present invention, will be obtained by reference to the following detailed description and drawings.

DETAILED DESCRIPTION OF PREFERRED EMBODIMENTS

Provided herein are techniques for integrating photovoltaics into wearables (i.e., articles worn by a user). For instance, in one exemplary embodiment, the wearables include eyewear that a user might wear in the sun such as sunglasses, goggles, etc. Sunlight (or other light source) drives the photovoltaics to generate power that can be used for a variety of power-driven devices. By way of example only, the power-driven devices can be mobile devices such as smartphones, smartwatches, multimedia devices, etc. Further, the present techniques can be employed in powering smart eyewear technology. For instance, recent technology integrates information and technology capabilities with eyewear. A user wearing the eyewear might have access to a camera, global positioning system (GPS), information viewing screen/displays, wireless communication, etc. all of which require a power source to operate.

With regard to eyewear, there is a limited surface area which can be leveraged for placing the photovoltaics. The frame, for instance, has a small surface area (which can vary depending on the design) and does not always have surfaces facing the sun. Advantageously, the present techniques provide an effective way by which the photovoltaics are integrated with the viewable lens area of eyewear. See, for example, FIG. 1 and FIG. 2. To do so, provided herein are techniques for making the photovoltaics semi-transparent, thus not obstructing the wearer's path of vision. Furthermore, the photovoltaics are configured herein to block 99% or more of damaging ultraviolet (UV) light, and 95% or more of damaging high energy visible (HEV) light. Being able to block UV and HEV light is a favorable attribute for eyewear, especially sunglasses which are typically worn out in the sun. UV light is outside of the visible spectrum, and generally encompasses light with a wavelength of from about 30 nanometers (nm) to about 400 nm, and ranges therebetween. The UV spectrum consists of primarily three different bands, i.e., UVA (from about 300 nm to about 400 nm), UVB (from about 280 nm to about 300 nm), and UVC (from about 100 nm to about 280 nm). Advantageously, the present photovoltaics can block greater than about 99%, e.g., greater than about 99.9% of UVA, UVB, and UVC light rays. HEV light is high energy light in the wavelength range of from about 400 nm to about 500 nm, and can be damaging to the retina. Advantageously, the present photovoltaics can block from about 95% to about 99%, and ranges therebetween of these harmful HEV light rays. Accordingly, by 'semi-transparent' it is meant herein that the present photovoltaics block harmful, e.g., UV and HEV, light rays while permitting most visible light to pass through the lens.

Figure 1:
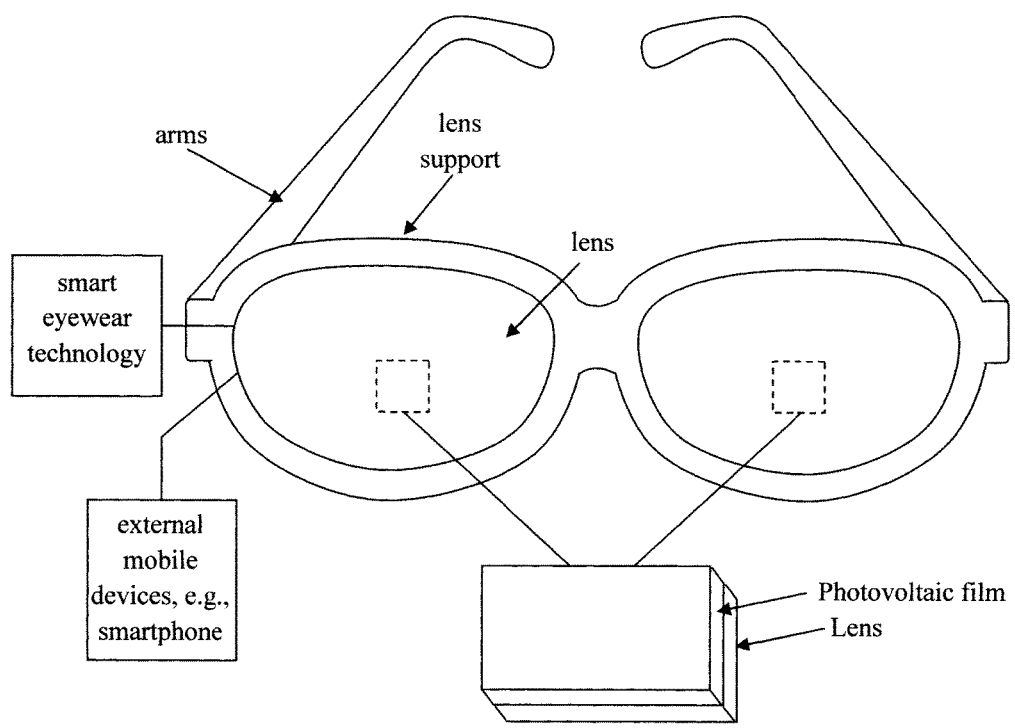
FIG. 1 is a diagram illustrating the present photovoltaic film having been integrated with the lenses of a pair of sunglasses according to an embodiment of the present invention.

In the example shown in FIG. 1, the eyewear is a pair of sunglasses. The photovoltaics are integrated into at least a portion of the viewable lens area of the sunglasses. For instance, the photovoltaics can be formed as a film on the lens. See FIG. 1. This film can cover the entire surface of each lens, or any portions thereof. Thus, when a user is wearing the sunglasses, the user's natural viewing through the lenses will constantly point the photovoltaics at light (i.e., a person will not typically wear sunglasses in low-light environments). Thus, photovoltaic energy production will be available wherever the user/wearer is located.

As shown in FIG. 1, the photovoltaics are used as a power source to operate smart eyewear technology (e.g., a camera, GPS, information viewing screen/displays, wireless communication, etc.) and/or other mobile technology, such as a smartphone, smartwatch, multimedia device(s), etc. See also, FIG. 2 (goggles) and FIG. 3 (neck strap).

Figure 2:
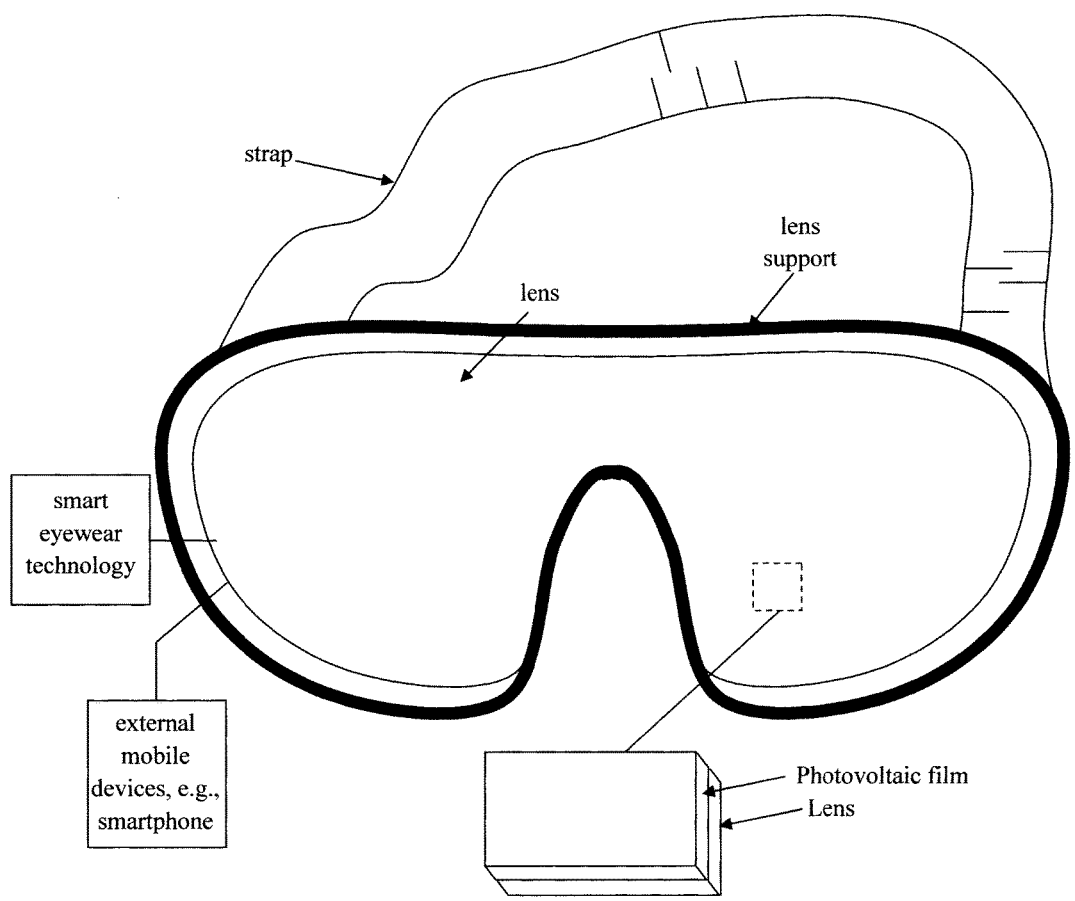
FIG. 2 is a diagram illustrating the present photovoltaic film having been integrated with the lens of a pair of goggles according to an embodiment of the present invention.
Figure 3:
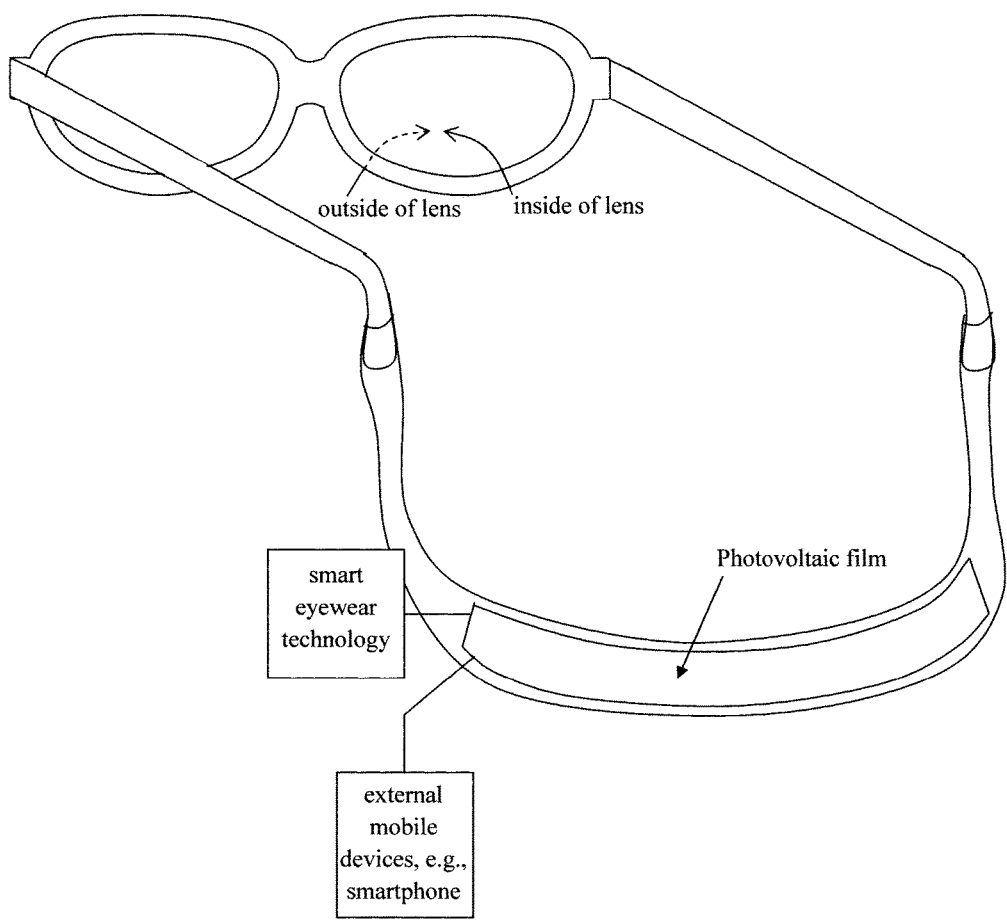
FIG. 3 is a diagram illustrating the present photovoltaic film having been integrated into an eyewear neck strap according to an embodiment of the present invention.

In the example shown in FIG. 1, the photovoltaics are integrated with traditional eyewear having two lenses. The present techniques are however not limited to any one configuration in particular. For instance, goggles are often employed in sports and recreational activities, such as skiing and biking. Goggle designs can employ a single lens. See FIG. 2. As shown in FIG. 2, the present photovoltaics may be integrated with that goggle lens in the same manner. In addition to the lens viewable area, the eyewear designs presented herein provide further locations in which the photovoltaics can be placed. For instance, as shown in FIG. 3, the photovoltaics can be affixed to a neck strap attached to the eyewear. The neck strap is connected at each end thereof to the arms of (in this example) sunglasses. When the sunglasses are worn by a user, the neck strap is placed behind the head. That way, when the sunglasses are removed the neck strap will secure the glasses to the user.

Either during use, or when the sunglasses are removed and secured to the user via the neck strap, the neck strap is often exposed to incident light. Thus, by placing the photovoltaics on the neck strap, one can effectively absorb the incident light and, e.g., further supplement the capabilities of the lens photovoltaics. While only one side of the strap is visible in the figure, it is notable that the photovoltaics can optionally be applied to both sides of the neck strap, if so desired. That way light can be captured regardless of the orientation of the neck strap.

Figure 4:
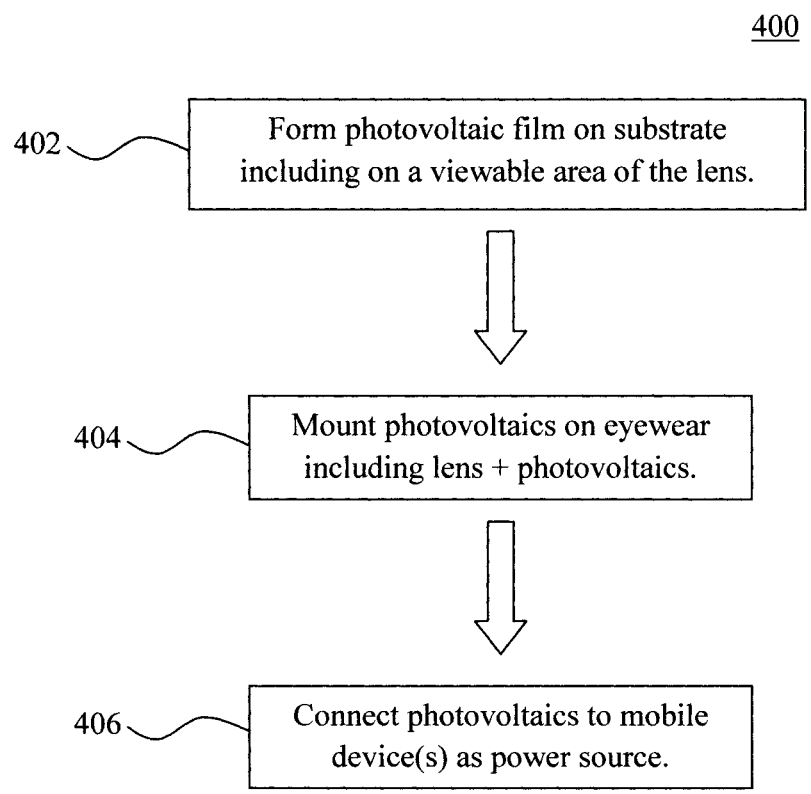
FIG. 4 is a diagram illustrating an exemplary methodology for fabricating photovoltaic eyewear according to an embodiment of the present invention.

An overview of the present process for fabricating photovoltaic eyewear is provided in FIG. 4, followed by some exemplary embodiments for fabricating the photovoltaics for the lens(es), strap, etc. of the photovoltaic eyewear.

Referring to methodology 400 of FIG. 4, in step 402 a photovoltaic film is formed on a substrate. According to an exemplary embodiment, the substrate is a lens material, such as glass, plastic, polycarbonate, etc., and thus the photovoltaics are formed on the lens. More specifically, the photovoltaics are formed on at least a portion of the viewable area of the lens.

As provided above, the present photovoltaics may also be applied to other (non-lens) regions of the eyewear, such as along a neck strap. In that case, the photovoltaics may be formed on a substrate that is easily adhered (e.g., using an adhesive) to the non-lens region, such as a plastic substrate (which advantageously remains pliable along the length of the strap).

In step 404, the lens, complete with photovoltaics, is mounted to the eyewear frame. In the example shown in FIG. 1, for example, the frame consists of a support structure to which the lens(es) are mounted, and arms that attach to the lens support structure. Of course, a variety of different, suitable eyewear configurations are known in the art. The goggles shown in FIG. 2 include a lens support to which the lens is mounted. Instead of arms, goggles oftentimes are secured to the user's head via an elastic strap.

In step 406, the photovoltaics are connected to one or more (e.g., mobile) devices. See above. Whenever a user of the eyewear is in the light, the photovoltaics will generate power that can be utilized to power the devices and/or stored (e.g., via a battery) for later use. An exemplary embodiment for integrating the present photovoltaic lenses with sunglasses or other eyewear and electronic devices and/or batteries for power storage is described in detail below.

A couple of different configurations of the photovoltaics are contemplated herein. One employs a substrate configuration, and the other a superstrate configuration. With a substrate configuration, the substrate is at an opposite end of the film stack from the end which light primarily enters the film stack, i.e., light enters the stack at an opposite end from the substrate. By contrast, with a superstrate configuration light enters the stack at the same end as the substrate (i.e., light enters the stack through the substrate).

In a first exemplary embodiment, described by way of reference to FIGS. 5-12, a substrate configuration is employed. The process begins with a substrate 502. According to an exemplary embodiment, the substrate 502 is suitable eyewear lens material such as glass, plastic, polycarbonate, etc. Optionally, one or more (first) contacts 504 can be formed on the substrate 502. The contacts 504 (along with optional contacts 1202—see below) provide a convenient means at the back and front of the photovoltaic film for extracting power.

Figure 5:
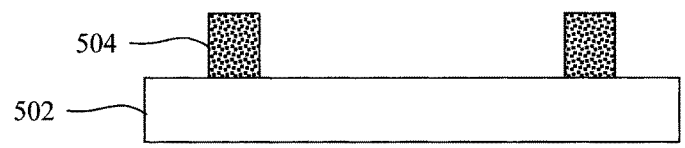
FIG. 5 is a cross-sectional diagram illustrating optional (first) contacts having been formed on a substrate according to an embodiment of the present invention.
Figure 6:
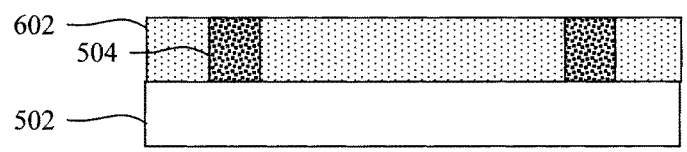
FIG. 6 is a cross-sectional diagram illustrating a (first) transparent conducting oxide (TCO) having been formed on the substrate over the first contacts (if present) according to an embodiment of the present invention.
Figure 7:
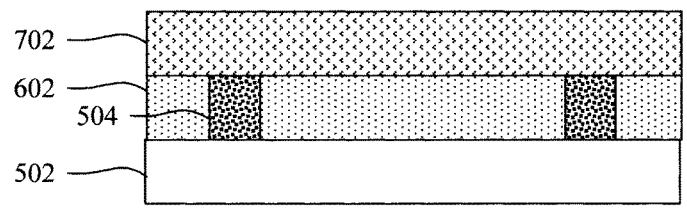
FIG. 7 is a cross-sectional diagram illustrating an optional back-surface field layer having been formed on the first TCO according to an embodiment of the present invention.
Figure 8:
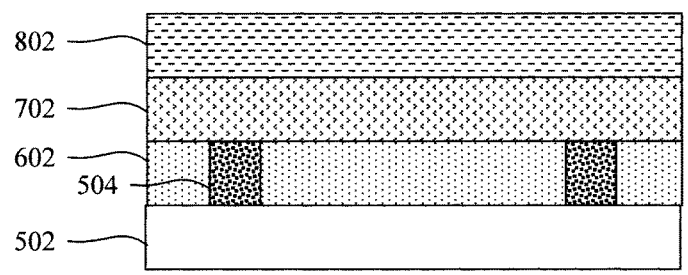
FIG. 8 is a cross-sectional diagram illustrating a (p-type) photovoltaic absorber layer having been formed on the back-surface field layer (if present) or directly on the first TCO according to an embodiment of the present invention.
Figure 9:
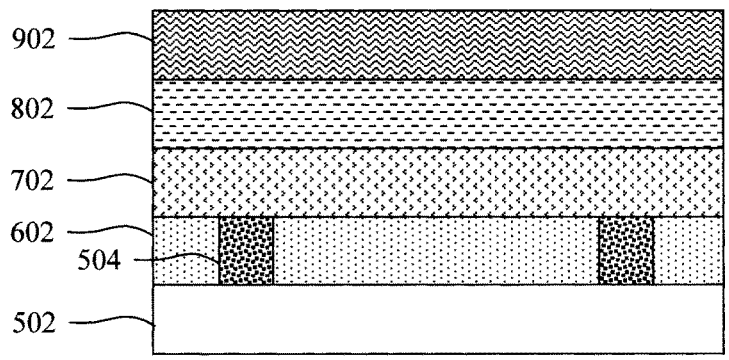
FIG. 9 is a cross-sectional diagram illustrating an n-type layer having been formed on the absorber layer according to an embodiment of the present invention.
Figure 10:
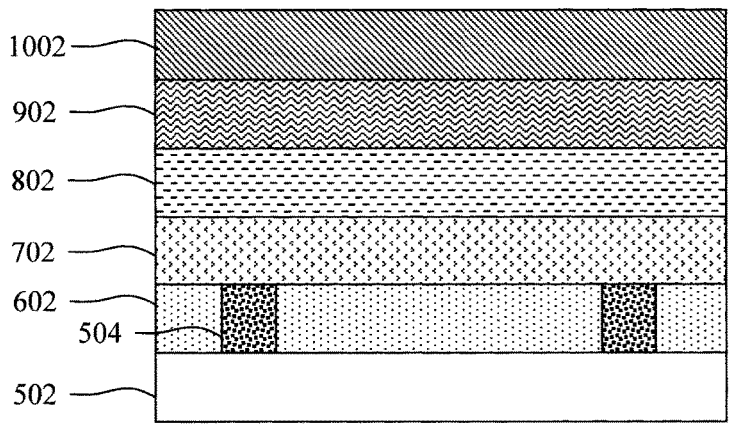
FIG. 10 is a cross-sectional diagram illustrating an optional buffer layer having been formed on the n-type layer according to an embodiment of the present invention.
Figure 11:
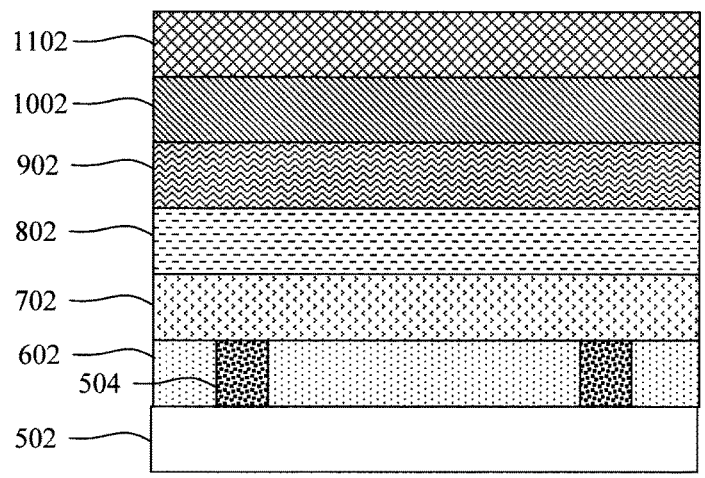
FIG. 11 is a cross-sectional diagram illustrating a (second) TCO having been deposited on the buffer layer (if present) or directly on the n-type layer according to an embodiment of the present invention.
Figure 12:
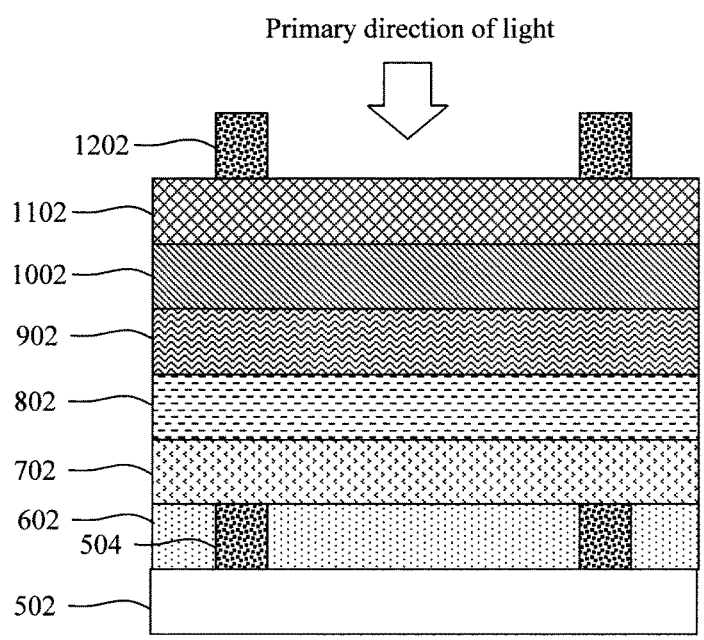
FIG. 12 is a cross-sectional diagram illustrating one or more optional (second) contacts having been formed on the second TCO according to an embodiment of the present invention.

According to an exemplary embodiment, the contacts 504 are formed from a metal(s) including, but not limited to, aluminum (Al), gold (Au), silver (Ag), and/or molybdenum (Mo). These metals can be deposited onto the substrate 502 using a process such as sputtering, evaporation, screen printing, etc. As shown in FIG. 5, when forming the present photovoltaics on an eyewear lens, the contacts 504 (if present) are preferably located off to the sides of the viewable area of the lens/substrate 502. That way, the contacts 504 are not noticeable to a user looking through the lens. Additionally, the contacts 504 can be made thin, e.g., having a thickness of from about 2 nanometers (nm) to about 5 nm, and ranges therebetween, which makes them transparent and thus less noticeable to the user.

A (first) transparent conducting oxide (TCO) 602 is then deposited on the substrate 502 over, and surrounding, the contacts 504 (if present). See FIG. 6. Suitable TCOs include, but are not limited to, indium-tin-oxide (ITO), fluorine-doped tin oxide (FTO), and/or aluminum-doped zinc oxide (AZO). The TCO 602 can be deposited onto the substrate 502 using a process such as sputtering, evaporation, or solution processing (e.g., casting).

A back-surface field layer 702 can next be formed on the TCO 602. See FIG. 7. The use of back-surface field layer 702 is optional. The back-surface field layer 702 is formed from a high workfunction material. By 'high' workfunction, it is meant for example that the back-surface field layer 702 material has a workfunction of greater than about 5.2 electron volts (eV). For instance, a suitable material for back-surface field layer 702 is molybdenum trioxide ($MoO_3$) which has a work function of about 6.6 eV. The back-surface field layer 702 serves to increase the workfunction of the TCO 602. The back-surface field layer 702 may be deposited using a process such as evaporation or sputtering.

A (p-type) photovoltaic absorber layer 802 is then formed on the TCO 602 (or on the back-surface field layer 702, if present). See FIG. 8. According to an exemplary embodiment, the absorber layer 802 includes a semitransparent inorganic absorber material having a band gap of greater than about 1.4 eV, e.g., from about 1.4 eV to about 2.2 eV, and ranges therebetween, which blocks greater than about 99% (e.g., greater than about 99.9%) of harmful UVA, UVB, and UVC light rays, and from about 95% to about 99%, and ranges therebetween, of harmful HEV light rays from passing therethrough. The UV-blocking aspect is highly desirable for eyewear, and especially sunglass, applications.

For example, in one exemplary configuration, the absorber layer 802 is formed from a chalcogen material including, but not limited to, sulfur (S) and/or selenium (Se). By way of example only, a pure Se absorber is employed in one instance, wherein the absorber layer 802 includes from about 90% to about 99.999%, and ranges therebetween, of Se. In addition to meeting the above band gap (i.e., pure Se has a bandgap of greater than or equal to about 1.74 eV) and UV/HEV blocking requirements, a pure Se absorber can be deposited quickly at low cost.

Further, it has been found that incorporating a fullerene-based semiconductor layer in contact with the Se layer in an Se-based solar cell can reduce I-V hysteresis, as well as improve power-conversion-efficiency voltage and open-circuit voltage in such solar devices. See, for example, U.S. patent application Ser. No. 15/431,900, by Bishop et al., entitled "Selenium-Fullerene Heterojunction Solar Cell," the contents of which are incorporated by reference as if fully set forth herein.

Following deposition of a chalcogen absorber layer 802, an anneal can be performed to crystallize the layer. By way of example only, this crystallization anneal can be performed at a temperature of greater than or equal to about 50° C., e.g., from about 50° C. to about 210° C., and ranges therebetween) for a duration of from about 30 seconds to about 5 minutes, and ranges therebetween.

A protective interlayer can be employed to protect the absorber layer during subsequent deposition of the second TCO (see below). See, for example, U.S. patent application Ser. No. 15/431,878, by Bishop et al., entitled "Semitransparent Chalcogen Solar Cell," the contents of which are incorporated by reference as if fully set forth herein.

In another exemplary configuration, the absorber layer 802 is formed from amorphous silicon and alloys thereof such as amorphous silicon carbide. Amorphous silicon and alloys thereof meet the above band gap and UV/HEV blocking requirements. Adding carbon to the amorphous silicon (e.g., as in the case of amorphous silicon carbide) can be used to increase the band gap. For a discussion of amorphous silicon absorbers see, for example, Ablayev et al., "Semitransparent solar modules based on amorphous and microcrystalline silicon," Journal of Physics: Conference Series, vol. 572 (December 2014), the contents of which are incorporated by reference as if fully set forth herein.

Following deposition of an amorphous silicon or alloy thereof absorber layer 802, an anneal can be performed to crystallize the layer. By way of example only, this crystallization anneal can be performed at a temperature of greater than or equal to about 50° C., e.g., from about 150° C. to about 300° C., and ranges therebetween) for a duration of from about 30 seconds to about 5 minutes, and ranges therebetween.

In yet another exemplary configuration, the absorber layer 802 is formed from a metal chalcogenide semiconductor including, but not limited to, a chalcopyrite or a kesterite material. Suitable chalcopyrite materials include, but are not limited to, $CuGa(S_x,Se_{1-x})_2$ wherein $0.15<x<1$, $CuIn(S_y,Se_{1-y})_2$ wherein $0.8<y<1$, and combinations thereof. Suitable kesterite materials include, but are not limited to, $Cu_2ZnSn(S_z,Se_{1-z})_4$ wherein $0.8<z<1$. These chalcopyrite and kesterite materials meet the above band gap and UV/HEV blocking requirements.

Following deposition of a chalcopyrite or kesterite absorber layer 802, an anneal can be performed to crystallize the layer. By way of example only, this crystallization anneal can be performed at a temperature of greater than or equal to about 300° C. (e.g., from about 300° C. to about 600° C., and ranges therebetween) for a duration of from about 1 minute to about 30 minutes, and ranges therebetween. This anneal can be performed in an environment containing excess tin (Sn), sulfur (S) and/or selenium (Se) to counteract the volatility of these components during the anneal. See, for example, U.S. Pat. No. 9,472,709 issued to Mahajan et al., entitled "Anneal Techniques for Chalcogenide Semiconductors," the contents of which are incorporated by reference as if fully set forth herein.

In still yet another exemplary configuration, the absorber layer 802 is formed from an inorganic or hybrid organic-inorganic perovskite material. The term 'perovskite' refers to materials with a perovskite structure and the general formula $ABX_3$ (e.g., wherein $A=CH_3NH_3$ or $NH=CHNH_3$, B=lead (Pb) or tin (Sn), and X=chlorine (Cl) or bromine (Br) or iodine (I)). The perovskite structure is described, for example, in U.S. Pat. No. 6,429,318 B1 issued to Mitzi, entitled "Layered Organic-Inorganic Perovskites Having Metal-Deficient Inorganic Frameworks" (hereinafter "U.S. Pat. No. 6,429,318"), the contents of which are incorporated by reference as if fully set forth herein. As described in U.S. Pat. No. 6,429,318, perovskites generally have an $ABX_3$ structure with a three-dimensional network of corner-sharing $BX_6$ octahedra, wherein the B component is a metal cation that can adopt an octahedral coordination of X anions, and the A component is a cation located in the 12-fold coordinated holes between the $BX_6$ octahedra. The A component can be an organic or inorganic cation. See, for example, FIGS. 1a and 1b of U.S. Pat. No. 6,429,318. These perovskites meet the above band gap and UV/HEV blocking requirements.

Advantageously, perovskite solar cells can have efficiencies exceeding 15%. See, for example, Liu et al., "Efficient planar heterojunction perovskite solar cells by vapour deposition," Nature vol. 501, 395-398 (September 2013), the contents of which are incorporated by reference as if fully set forth herein. Perovskite materials also advantageously have large band gaps (1.5 eV to 2 eV). See, for example, A. Kojima et al., "Organometal Halide Perovskites as Visible-Light Sensitizers for Photovoltaic Cells," Journal of the American Chemical Society, vol. 131, pp. 6050-6051, (April 2009), the contents of which are incorporated by reference as if fully set forth herein.

Following deposition of a perovskite absorber layer 802, an anneal can be performed to crystallize the layer. By way of example only, this crystallization anneal can be performed at a temperature of greater than or equal to about 50° C., e.g., from about 50° C. to about 150° C., and ranges therebetween) for a duration of from about 30 seconds to about 5 minutes, and ranges therebetween.

In a further exemplary configuration, the absorber layer 802 is formed from a III-V compound semiconductor material (or simply a III-V material). A III-V material includes at least one group III element and at least one group V element. Suitable III-V materials include, but are not limited to, gallium phosphide (GaP), gallium arsenide (GaAs), aluminum arsenide (AlAs), aluminum antimonide (AlSb), indium phosphide (InP), and combinations thereof. These III-V materials meet the above band gap and UV/HEV blocking requirements.

For the materials, they may be epitaxially grown at a temperature of from about 550° C. to about 750° C., and ranges therebetween either by metal organic chemical vapor deposition (MOCVD) or molecular beam epitaxy (MBE). These techniques allow the epitaxial growth needed because the high performing devices are single crystal. To be transparent, the III-V materials are preferably grown and then exfoliated from the growth substrate by an epitaxial lift off process, and transferred onto polyimide or other substrate which in this case could be the lens. See, for example, Moon et al., "Highly efficient single-junction GaAs thin-film solar cell on flexible substrate," Nature, Scientific Reports 6, Article no. 30107, (July 2016) (6 pages), the contents of which are incorporated by reference as if fully set forth herein. This allows the materials to be thin (potentially sub-micrometer) which is what would be needed.

An n-type layer 902 is next formed on the (p-type) absorber layer 802. See FIG. 9. A p-n junction is formed between the n-type layer 902 and the absorber layer 802. Suitable n-type materials for layer 902 include, but are not limited to, cadmium oxide (CdO), cadmium sulfide (CdS), a cadmium-zinc-sulfur material of the formula $Cd_{1-x}Zn_xS$ (wherein $0<x\leq1$), indium sulfide ($In_2S_3$), zinc oxide, zinc oxysulfide (e.g., a Zn(O,S) or Zn(O,S,OH) material), aluminum oxide ($Al_2O_3$), titanium oxide ($TiO_2$), and/or a zinc magnesium oxide (ZMO) material with the formula $Zn_{1-x}Mg_xO$, wherein $0\leq x\leq 0.4$ The n-type layer 902 can be deposited onto the absorber 802 using a process such as sputtering, evaporation, or solution processing (e.g., casting).

Optionally, a buffer layer 1002 is formed on the n-type layer 902. See FIG. 10. Suitable materials for the buffer layer 1002 include, but are not limited to, zinc oxide (ZnO). The buffer layer 1002 can be deposited onto the n-type layer 902 using a process such as sputtering, evaporation, or solution processing (e.g., casting). The buffer layer 1002, while optional, can beneficially provide a protective layer during deposition of the final TCO (i.e., TCO 1102—see below) which can be deposited using a process such as sputtering which can damage what is underneath. The use of a buffer layer can also help prevent shunting.

A (second) TCO 1102 is then deposited on the buffer layer 1002, if present, or alternatively directly on the n-type layer 902. See FIG. 11. As provided above, suitable TCOs include, but are not limited to, ITO, FTO, and/or AZO, deposited (onto the buffer layer 1002 or n-type layer 902) using a process such as sputtering, evaporation, or solution processing (e.g., casting).

Optionally, one or more (second) contacts 1202 can be formed on the TCO 1102. See FIG. 12. The contacts 1202 (along with optional contacts 504—see above) provide a convenient means at the back and front of the photovoltaic film for extracting power. As above, suitable materials for the contacts 1202 include, but are not limited to, metals such as Al, Au, Ag, and/or Mo, which can be deposited (onto the TCO 1102) using a process such as sputtering, evaporation, screen printing, etc.

With the present substrate configuration, the substrate 502 is at an end of the film stack that is opposite the end through which light primarily enters the film stack. See FIG. 12. In that case, the photovoltaics (as represented in FIGS. 5-12) would be built layer by layer on the lens material (as the substrate) such that the photovoltaics will form a film on the outside of the lens(es) (i.e., the side of the lens(es) facing away from the user—see for example FIG. 2), similar to what is shown in FIGS. 1 and 2 (wherein the "photovoltaic film" generically represents for example the photovoltaic structure shown in FIG. 12). Alternatively, a superstrate configuration might instead be employed. As provided above, with a superstrate configuration light enters the stack through the substrate. Thus in that case, the photovoltaics (as represented in FIGS. 13-19, see below) would be built layer by layer on the lens material (as the substrate) such that the photovoltaics will form a film on the inside of the lens(es) (i.e., the side of the lens(es) facing toward the user). This would be opposite to what is shown in FIGS. 1 and 2 wherein the "lens" and the "photovoltaic film" would switch positions (and the "photovoltaic film" generically representing for example the photovoltaic structure shown in FIG. 19).

Figure 13:
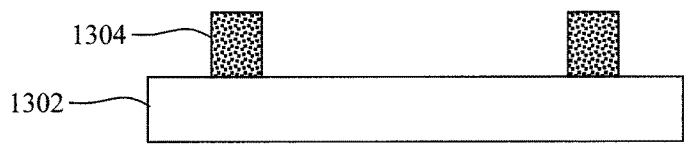
FIG. 13 is a cross-sectional diagram illustrating, according to an alternative embodiment, optional (first) contacts having been formed on a substrate according to an embodiment of the present invention.
Figure 14:
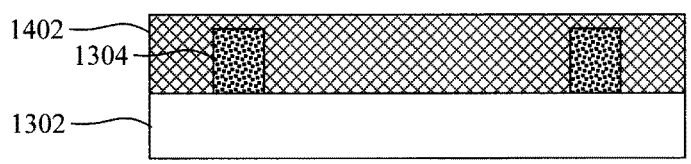
FIG. 14 is a cross-sectional diagram illustrating a (first) TCO having been formed on the substrate over the first contacts (if present) according to an embodiment of the present invention.
Figure 15:
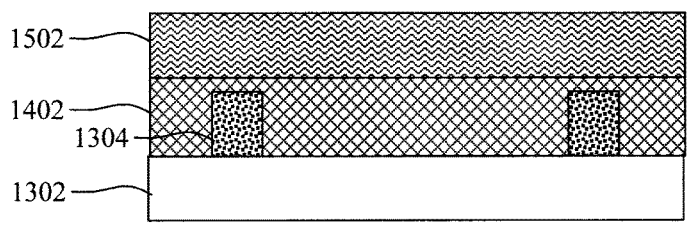
FIG. 15 is a cross-sectional diagram illustrating an n-type layer having been formed on the first TCO according to an embodiment of the present invention.
Figure 16:
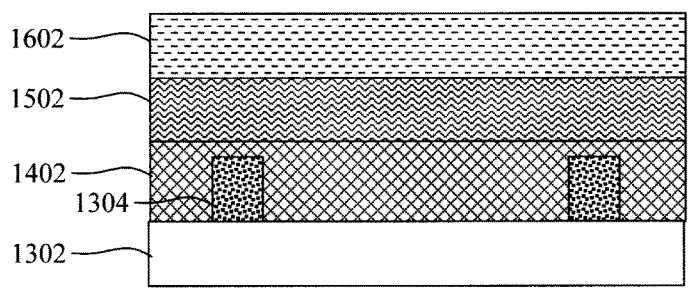
FIG. 16 is a cross-sectional diagram illustrating a (p-type) photovoltaic absorber layer having been formed on the n-type layer according to an embodiment of the present invention.
Figure 17:
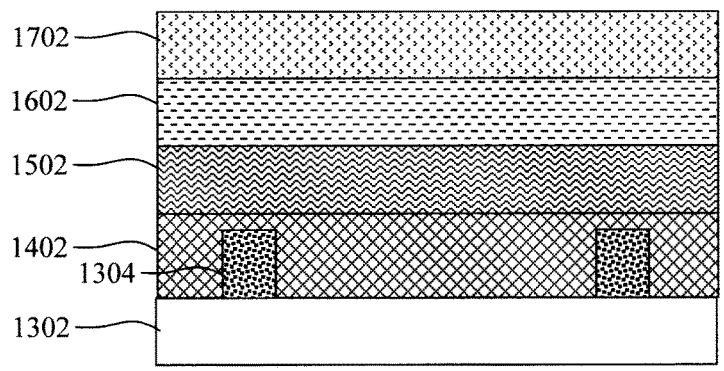
FIG. 17 is a cross-sectional diagram illustrating an optional back field layer having been formed on the absorber layer according to an embodiment of the present invention.
Figure 18:
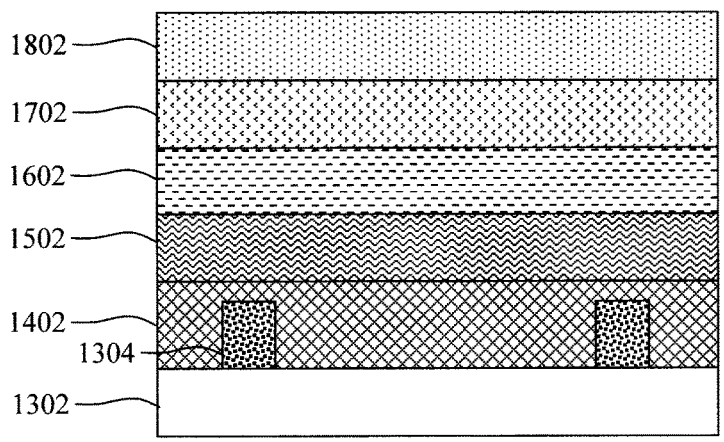
FIG. 18 is a cross-sectional diagram illustrating a (second) TCO having been deposited on the back field layer (if present) or directly on the absorber layer according to an embodiment of the present invention.
Figure 19:
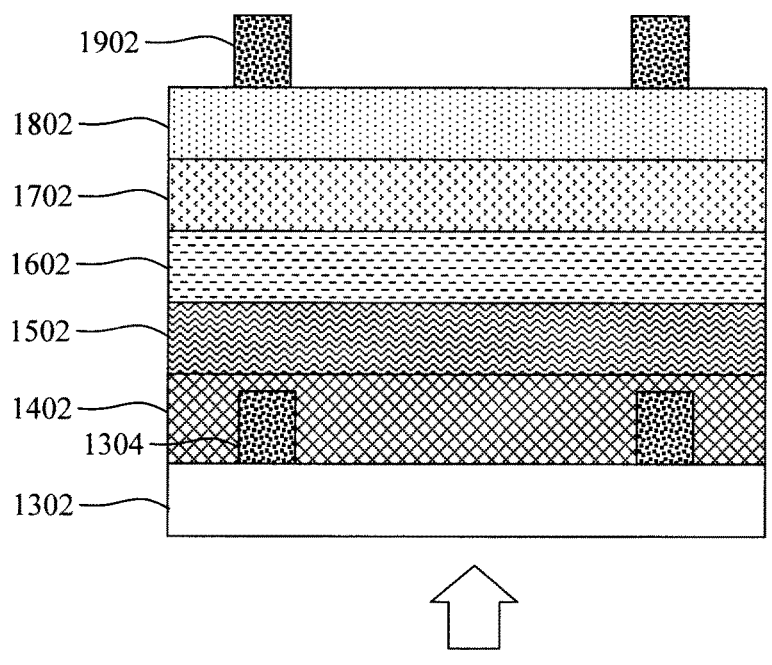
FIG. 19 is a cross-sectional diagram illustrating one or more (second) contacts having been formed on the second TCO according to an embodiment of the present invention.

Thus, in another exemplary embodiment, described by way of reference to FIGS. 13-19, a superstrate configuration is employed. As shown in FIG. 13, the process begins with a substrate 1302. According to an exemplary embodiment, the substrate 1302 is suitable eyewear lens material such as glass, plastic, polycarbonate, etc. Optionally, one or more (first) contacts 1304 can be formed on the substrate 1302. See FIG. 13. The contacts 1304 (along with optional contacts 1902—see below) provide a convenient means at the back and front of the photovoltaic film for extracting power. As above, suitable materials for the contacts 1304 include, but are not limited to, metals such as Al, Au, Ag, and/or Mo, which can be deposited (onto the substrate 1302) using a process such as sputtering, evaporation, screen printing, etc.

A (first) TCO 1402 is then deposited on the substrate 1302 over the contacts 1304 (if present). See FIG. 14. As provided above, suitable TCOs include, but are not limited to, ITO, FTO, and/or AZO, deposited (onto the substrate 1302) using a process such as sputtering, evaporation, or solution processing (e.g., casting).

An n-type layer 1502 is next formed on the TCO 1402. See FIG. 15. As provided above, suitable n-type materials for layer 1502 include, but are not limited to, CdO, CdS, a cadmium-zinc-sulfur material of the formula $Cd_{1-x}Zn_xS$ (wherein $0<x\leq1$), $In_2S_3$, zinc oxide, zinc oxysulfide (e.g., a Zn(O,S) or Zn(O,S,OH) material), $Al_2O_3$, $TiO_2$, and/or a ZMO material with the formula $Zn_{1-x}Mg_xO$, wherein $0\leq x\leq0.4$, deposited (onto the TCO 1402) using a process such as sputtering, evaporation, or solution processing (e.g., casting).

A p-type photovoltaic absorber layer 1602 is formed on the n-type layer 1502. A p-n junction is formed between the n-type layer 1502 and the absorber layer 1602. According to an exemplary embodiment, the absorber layer 1602 includes a semitransparent inorganic absorber material having a band gap of greater than about 1.4 eV, e.g., from about 1.4 eV to about 2.2 eV, and ranges therebetween, which blocks greater than about 99% (e.g., greater than about 99.9%) of harmful UVA, UVB, and UVC light rays, and from about 95% to about 99%, and ranges therebetween, of harmful HEV light rays from passing therethrough. As provided above, suitable absorber materials meeting these band gap and UV/HEV blocking requirements include, but are not limited to, chalcogens such as S, Se (e.g., pure Se—from about 90% to about 99.999%, and ranges therebetween, of Se), amorphous silicon and alloys thereof (e.g., amorphous silicon carbide), chalcopyrites (e.g., $CuGa(S_x,Se_{1-x})_2$ wherein $0.15<x<1$ and/or $CuIn(S_y,Se_{1-y})_2$ wherein $0.8<y<1$), kesterites (e.g., $Cu_2ZnSn(S_z,Se_{1-z})_4$ wherein $0.8<z<1$), inorganic or hybrid organic-inorganic perovskites, and/or a III-V material (e.g., GaP, GaAs, AlAs, AlSb and/or InP). As provided above, a crystallization anneal may be performed after deposition of the absorber material. The conditions of this anneal were provided above.

An optional back-surface field layer 1702 can next be formed on the absorber layer 1602. See FIG. 17. The back-surface field layer 1702 is formed from a high workfunction material (e.g., a material having a workfunction of greater than about 5.2 eV). For example, a suitable material for back-surface field layer 1702 is $MoO_3$ which has a workfunction of about 6.6 eV. The back-surface field layer 1702 serves to increase the workfunction of the TCO 1802 (see below). The back-surface field layer 1702 may be deposited using a process such as evaporation or sputtering.

A (second) TCO 1802 is then deposited on the back-surface field layer 1702, if present, or alternatively directly on the absorber layer 1602. See FIG. 18. As provided above, suitable TCOs include, but are not limited to, ITO, FTO, and/or AZO, deposited (onto the back-surface field layer 1702 or absorber 1602) using a process such as sputtering, evaporation, or solution processing (e.g., casting).

Optionally, one or more (second) contacts 1902 can be formed on the TCO 1802. See FIG. 19. The contacts 1902 (along with optional contacts 1304—see above) provide a convenient means at the back and front of the photovoltaic film for extracting power. As above, suitable materials for the contacts 1902 include, but are not limited to, metals such as Al, Au, Ag, and/or Mo, which can be deposited (onto the TCO 1802) using a process such as sputtering, evaporation, screen printing, etc.

With this alternative superstrate configuration, light primarily enters the film stack through the substrate 1302. See FIG. 19. In that case, the photovoltaics (as represented in FIGS. 13-19) would be built layer by layer on the lens material (as the substrate) such that the photovoltaics will form a film on the inside of the lens(es).

Figure 20A:
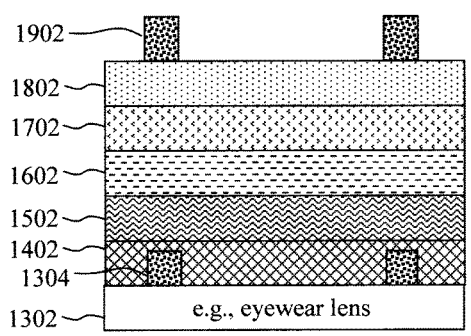
FIG. 20A is a cross-sectional diagram illustrating a photovoltaic film having a superstrate configuration according to an embodiment of the present invention.
Figure 20B:
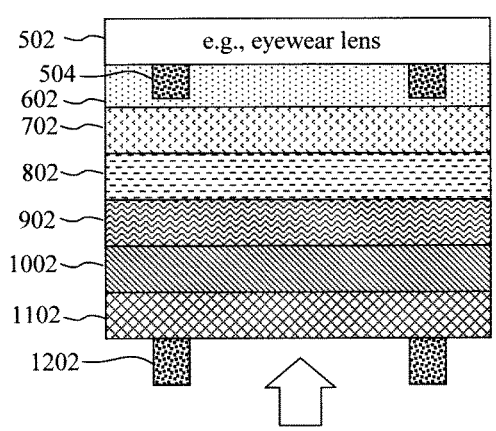
FIG. 20B is a cross-sectional diagram illustrating a photovoltaic film having a substrate configuration according to an embodiment of the present invention.

FIGS. 20A and 20B compare superstrate and substrate configurations, respectively, both aligned along the primary direction of light. The same structures from the above-described process flows are numbered alike in FIGS. 20A and 20B. As shown in FIG. 20A, with a superstrate configuration light enters the stack at the same end as the substrate (i.e., light enters the stack through the substrate). By comparison, as shown in FIG. 20B, with a substrate configuration the substrate is at an opposite end of the film stack from the end which light primarily enters the film stack, i.e., light enters the stack at an opposite end from the substrate.

While, as highlighted above, the present substrate and/or superstrate photovoltaic films can be formed on the lens (i.e., with the lens serving as the substrate in the process flow—see above), these photovoltaic films can also be implemented elsewhere on the eyewear. For instance, as described in conjunction with the description of FIG. 3 above, the present photovoltaic films can be affixed to a neck strap attached to the eyewear. In that case, the photovoltaic film can be formed (in the same manner as described above) on a given substrate (e.g., glass, plastic, polycarbonate, see above), and then affixed (e.g., using an adhesive) to the neck strap). Of course, the substrate used for the neck strap photovoltaics would not be the lens per se, however the same substrate materials may be employed.

Figure 21:
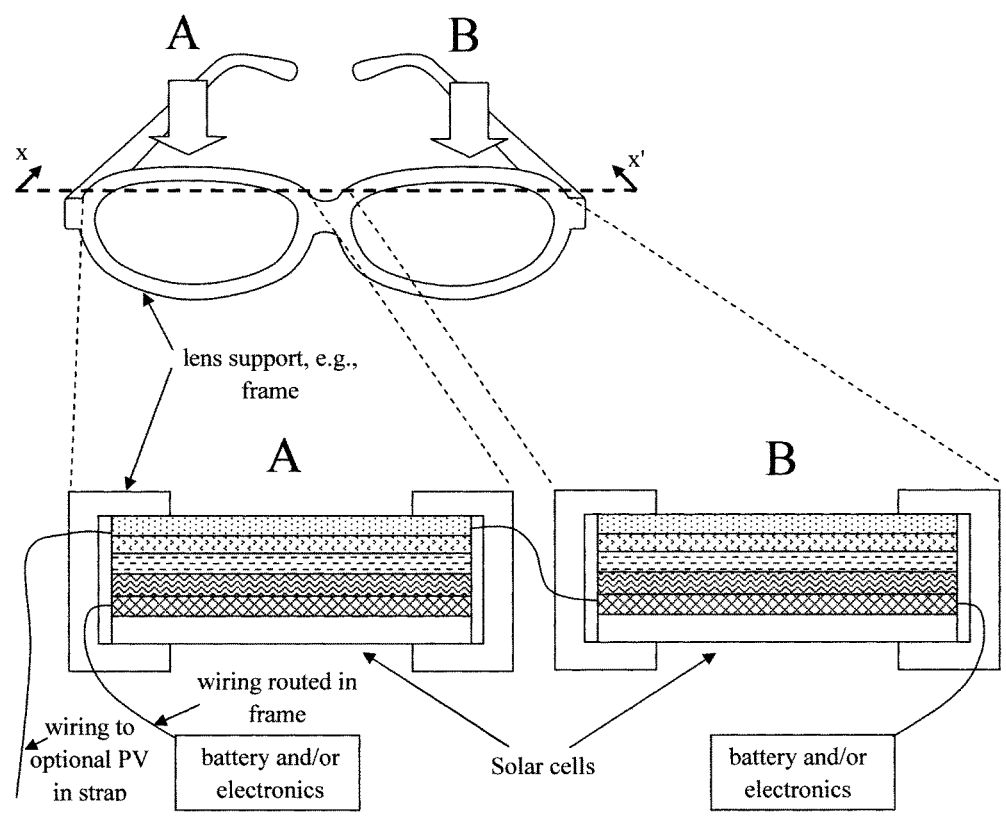
FIG. 21 is a diagram illustrating how the present photovoltaic lenses can be integrated with sunglasses or other eyewear and electronic devices and/or batteries for power storage according to an embodiment of the present invention.

FIG. 21 is a diagram illustrating how the present photovoltaic lenses can be integrated with sunglasses or other eyewear and electronic devices and/or batteries for power storage. A variety of wiring options are schematically shown. FIG. 21 depicts an expanded view of the two lenses of an exemplary sunglasses design from top vantage points A and B, respectively. Vantage points A/B provide top-down views of a cross-section x-x' through the lens and lens support a.k.a. frame. According to an exemplary embodiment, the frame is formed from an electrically insulating material, such as plastic. The solar cell lens fits within a channel in the frame, and wiring is run throughout the frame connecting the TCOs at the front and backs of the solar cell to i) interconnect the solar cells in series and ii) connect the solar cells to devices (both on the eyewear itself and external devices) and/or to power storing means such as a battery. By way of example only, the devices can include, but are not limited to, wireless communication devices, charging electronics, camera, sensors, and variety of other mobile electronics. As shown in FIG. 21, wiring is also provided to connect the photovoltaics (PV), if any, present on the neck strap (see above) with those on the lenses. For illustrative purposes only, the above-described superstrate configuration is shown in FIG. 21. However, any of the present photovoltaics designs can be implemented in the same manner described.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of forming a lens for photovoltaic eyewear, the method comprising the step of:
    forming a semitransparent photovoltaic film on at least a portion of a viewable area of the lens, wherein the semitransparent photovoltaic film comprises an inorganic absorber material having a band gap of from about 1.4 eV to about 2.2 eV, and ranges therebetween.

2. The method of claim 1, wherein the semitransparent photovoltaic film is configured to block greater than about 99.9%, and ranges therebetween, of ultraviolet (UV) UVA, UVB, and UVC light rays, and from about 95% to about 99%, and ranges therebetween, of HEV light rays from passing therethrough.

3. The method of claim 1, wherein the inorganic absorber material comprises a material selected from the group consisting of: a chalcogen, amorphous silicon, amorphous silicon carbide, a chalcopyrite, a kesterite, a perovskite, a III-V material, and combinations thereof.

4. The method of claim 1, wherein the inorganic absorber material comprises from about 90% to about 99.999%, and ranges therebetween, of selenium (Se).

5. The method of claim 1, wherein the inorganic absorber material comprises a chalcopyrite selected from the group consisting of: $CuGa(S_x,Se_{1-x})_2$ wherein $0.15<x<1$, $CuIn(S_y,Se_{1-y})_2$ wherein $0.8<y<1$, and combinations thereof.

6. The method of claim 1, wherein the inorganic absorber material comprises a kesterite $Cu_2ZnSn(S_z,Se_{1-z})_4$ wherein $0.8<z<1$.

7. The method of claim 1, wherein the inorganic absorber material comprises a III-V material selected from the group consisting of: gallium phosphide (GaP), gallium arsenide (GaAs), aluminum arsenide (AlAs), aluminum antimonide (AlSb), indium phosphide (InP), and combinations thereof.

8. The method of claim 1, wherein the step of forming the semitransparent photovoltaic film on the lens comprises the steps of:
    depositing a first transparent conducting oxide on the lens;
    forming a photovoltaic absorber layer comprising the inorganic absorber material on the first transparent conducting oxide;
    forming an n-type layer on the photovoltaic absorber layer; and
    depositing a second transparent conducting oxide on the n-type layer.

9. The method of claim 8, further comprising the steps of:
    forming first metal contacts on the lens prior to depositing the first transparent conducting oxide; and
    forming second metal contacts on the second transparent conducting oxide,
    wherein the first metal contacts and the second metal contacts are each formed from a metal selected from the group consisting of: aluminum (Al), gold (Au), silver (Ag), molybdenum (Mo), and combinations thereof.

10. The method of claim 8, further comprising the step of:
    forming a back-surface field layer on the first transparent conducting oxide, wherein the back-surface field layer has a workfunction of greater than about 5.2 eV.

11. The method of claim 8, further comprising the step of:
    forming a buffer layer on the n-type layer.

12. The method of claim 1, wherein the step of forming the semitransparent photovoltaic film on the lens comprises the steps of:
    depositing a first transparent conducting oxide on the lens;
    forming an n-type layer on the first transparent conducting oxide;
    forming a photovoltaic absorber layer comprising the inorganic absorber material on the n-type layer; and
    depositing a second transparent conducting oxide on the photovoltaic absorber layer.

13. The method of claim 12, further comprising the steps of:
    forming first metal contacts on the lens prior to depositing the first transparent conducting oxide; and
    forming second metal contacts on the second transparent conducting oxide,
    wherein the first metal contacts and the second metal contacts are each formed from a metal selected from the group consisting of: Al, Au, Ag, Mo, and combinations thereof.

14. The method of claim 12, further comprising the step of:
    forming a back-surface field layer on the photovoltaic absorber layer, wherein the back-surface field layer has a workfunction of greater than about 5.2 eV.

15. Photovoltaic eyewear, comprising:
    at least one lens; and
    a semitransparent photovoltaic film on at least a portion of a viewable area of the at least one lens, wherein the semitransparent photovoltaic film comprises an inorganic absorber material having a band gap of from about 1.4 eV to about 2.2 eV, and ranges therebetween.

16. The photovoltaic eyewear of claim 15, wherein the semitransparent photovoltaic film is configured to block greater than about 99.9% UVA, UVB, and UVC light rays, and from about 95% to about 99%, and ranges therebetween, of HEV light rays from passing therethrough.

17. The photovoltaic eyewear of claim 15, wherein the inorganic absorber material comprises a material selected from the group consisting of: a chalcogen, amorphous silicon, amorphous silicon carbide, a chalcopyrite, a kesterite, a perovskite, a III-V material, and combinations thereof.

18. The photovoltaic eyewear of claim 15, wherein the semitransparent photovoltaic film is formed on an inside of the lens so as to face a user of the photovoltaic eyewear.

19. The photovoltaic eyewear of claim 15, wherein the semitransparent photovoltaic film is formed on an outside of the lens so as to face away from a user of the photovoltaic eyewear.

20. The photovoltaic eyewear of claim 15, wherein the semitransparent photovoltaic film comprises:
   a first transparent conducting oxide disposed on the lens;
   a photovoltaic absorber layer comprising the inorganic absorber material disposed on the first transparent conducting oxide;
   an n-type layer disposed on the photovoltaic absorber layer; and
   a second transparent conducting oxide disposed on the n-type layer.

21. The photovoltaic eyewear of claim 15, wherein the semitransparent photovoltaic film comprises:
   a first transparent conducting oxide disposed on the lens;
   an n-type layer disposed on the first transparent conducting oxide;
   a photovoltaic absorber layer comprising the inorganic absorber material disposed on the n-type layer; and
   a second transparent conducting oxide disposed on the photovoltaic absorber layer.

22. The photovoltaic eyewear of claim 15, further comprising:
   a neck strap attached to the eyewear; and
   the semitransparent photovoltaic film affixed to the neck strap.

* * * * *